United States Patent
Hashimoto et al.

(10) Patent No.: US 11,394,371 B2
(45) Date of Patent: Jul. 19, 2022

(54) SEMICONDUCTOR DEVICE

(71) Applicant: RENESAS ELECTRONICS CORPORATION, Tokyo (JP)

(72) Inventors: Chiemi Hashimoto, Tokyo (JP); Kosuke Yayama, Tokyo (JP); Tomokazu Matsuzaki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 411 days.

(21) Appl. No.: 16/534,592

(22) Filed: Aug. 7, 2019

(65) Prior Publication Data
US 2020/0076409 A1 Mar. 5, 2020

(30) Foreign Application Priority Data
Aug. 30, 2018 (JP) .............................. JP2018-161311

(51) Int. Cl.
*H01L 23/522* (2006.01)
*H03K 3/011* (2006.01)
*G01L 1/22* (2006.01)
*H01L 49/02* (2006.01)

(52) U.S. Cl.
CPC ............ *H03K 3/011* (2013.01); *G01L 1/2281* (2013.01); *H01L 23/5228* (2013.01); *H01L 28/20* (2013.01)

(58) Field of Classification Search
CPC .... H03K 3/011; H01L 23/5228; H01L 23/647
USPC .............................................. 73/37; 438/382
See application file for complete search history.

(56) References Cited

U.S. PATENT DOCUMENTS

| | | | |
|---|---|---|---|
| 8,946,827 B2 * | 2/2015 | Maeda | H03B 5/1237 257/379 |
| 2006/0145296 A1 * | 7/2006 | Coolbaugh | H01L 28/20 257/536 |
| 2018/0375497 A1 * | 12/2018 | Hashimoto | H03K 3/356113 |

FOREIGN PATENT DOCUMENTS

JP 2013-229509 A 11/2013

* cited by examiner

*Primary Examiner* — Joseph Chang
(74) *Attorney, Agent, or Firm* — McDermott Will & Emery LLP

(57) ABSTRACT

The polysilicon resistance has a large resistance variation rate after the end of the mold packaging process. In order to enable high-precision trimming, it is desired to realize a resistance which is hardly affected by stress and temperature fluctuation generated in a substrate by a mold packaging process. A resistance element is formed in a plurality of wiring layers, and has a first conductive layer formed in a first wiring layer, a second conductive layer formed in a second wiring layer, and a repeating pattern of an interlayer conductive layer connecting the first conductive layer and the second conductive layer, and the interlayer conductive layer is formed of a plurality of types of materials.

15 Claims, 19 Drawing Sheets

SEMICONDUCTOR DEVICE

CROSS-REFERENCE TO RELATED APPLICATIONS

The disclosure of Japanese Patent Application No. 2018-161311 filed on Aug. 30, 2018 including the specification, drawings and abstract is incorporated herein by reference in its entirety.

BACKGROUND

The present disclosure relates to a semiconductor device having resistance elements formed in wiring layers.

In case of an oscillation circuit is provided in the semiconductor device, a trimming circuit for trimming the frequency characteristics of the oscillation circuit is generally provided. The trimming circuit has a resistor, and the oscillation frequency of the oscillation circuit can be set to a desired value for each semiconductor device by adjusting the resistance value of the resistor. As a resistance element used in the trimming circuit, a polycrystalline silicon resistor used in forming a circuit element such as a transistor is known. The polysilicon resistor is excellent in that the polysilicon resistor can be formed without complicating the manufacturing process of the semiconductor device, and a high resistance can be realized with a high resistivity and a small area, but it is known that the resistance value fluctuates after the mold packaging process. This is because a resistance element (polycrystalline silicon resistance) on a silicon chip receives stress from a molding resin, and a resistance value changes due to a shape change, a piezoelectric effect, or the like. Japanese unexamined Patent Application publication 2013-229509 specifies a place where the polycrystalline silicon resistor is arranged in order to minimize the stress that the polycrystalline silicon resistor receives from the mold resin.

SUMMARY

According to Japanese unexamined Patent Application publication 2013-229509, a target is to suppress the resistance variation rate of the polycrystalline silicon resistor from the wafer state of the polycrystalline silicon resistor, i.e., the trimming completion state, to within approximately ±0.5% after the end of the mold package process. However, in recent years, the precision required for a trimming circuit has been high, and it is desirable to reduce the resistance variation rate as much as possible. Further, in the technique disclosed in Japanese unexamined Patent Application publication 2013-229509, since a place where a polycrystalline silicon resistor can be arranged is restricted, the degree of freedom of layout is inevitably low. In addition, the characteristic variation caused by the temperature variation also affects the accuracy of the oscillation frequency of the oscillation circuit. For this reason, a control circuit for controlling the temperature dependence of the oscillation frequency has been conventionally provided, but this increases the circuit area and also causes an increase in the power consumption of the chip.

Other objects and novel features will become apparent from the description of this specification and the accompanying drawings.

Resistance elements are realized which are formed on a plurality of wiring layers, have a main resistance in a direction perpendicular to the semiconductor substrate surface, and have a main resistance composed of a plurality of types of materials. It is possible to realize a resistor having a small resistance variation rate after the end of the mold packaging process and a small temperature characteristic variation.

It is possible to realize a resistor having a small resistance variation rate after the end of the mold packaging process and a small temperature characteristic variation.

DETAILED DESCRIPTION

Figure 1:
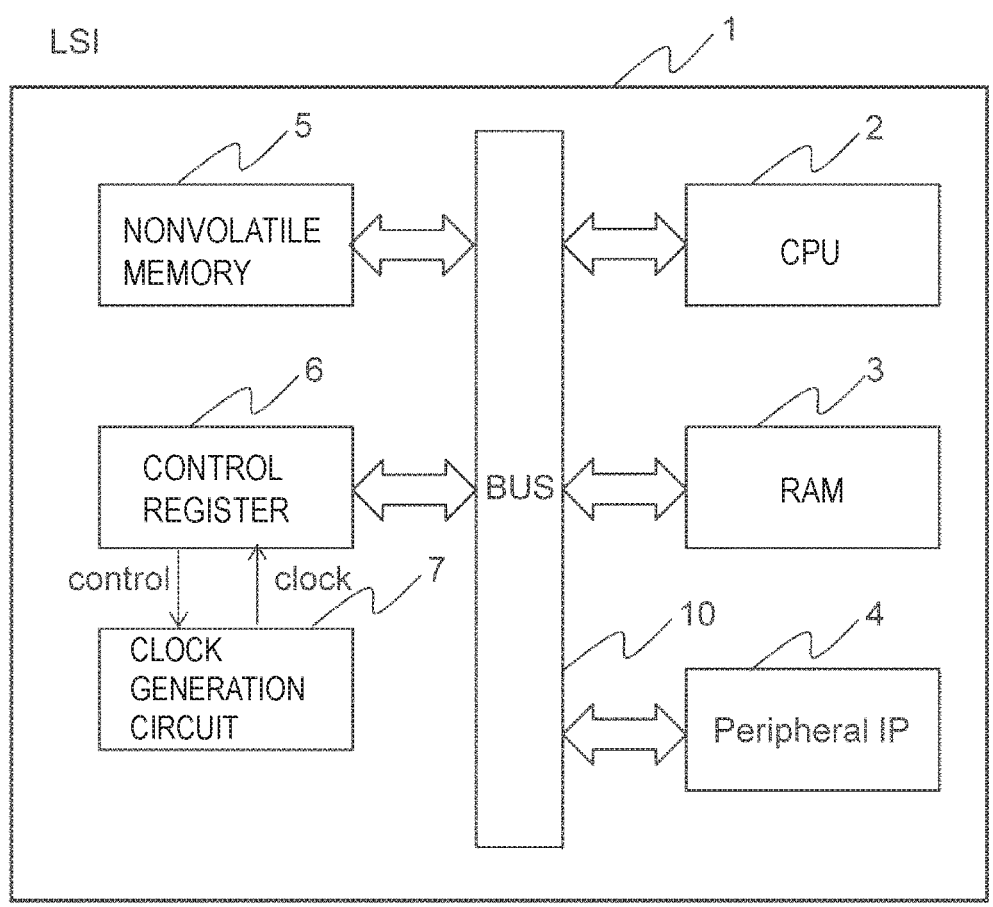
FIG. 1 is a locked diagram of semiconductor device.

Embodiments will be described below with reference to the drawings. FIG. 1 shows a semiconductor device 1 according to the present embodiment. Active elements such as transistors and passive elements such as resistors and capacitors are formed on the substrate of the semiconductor device 1. These elements are used to form various functional blocks in the semiconductor device 1. FIG. 1 shows, as examples of functional blocks, a CPU (Central Processing device) 2, a RAM 3, a peripheral IP4, and a nonvolatile memory 5. The peripheral IP may be, for example, an A/D converter. Addresses and data are exchanged between these functional blocks through a bus 10. A clock generation circuit 7 generates a clock from an oscillation signal of an on-chip oscillator incorporated therein and distributes the clock to these functional clocks through the bus 10. As will be described later in detail, the on-chip oscillator has a trimming resistor. By setting the resistance value of the trimming resistor to a predetermined value, the oscillation frequency of the on-chip oscillator is adjusted to a desired value for each semiconductor device 1. The trimming code required for trimming is written in the nonvolatile memory 5 or the RAM 3, and the resistance value of the trimming resistor is set to a predetermined value based on the trimming code read through a control register 6.

Figure 2:
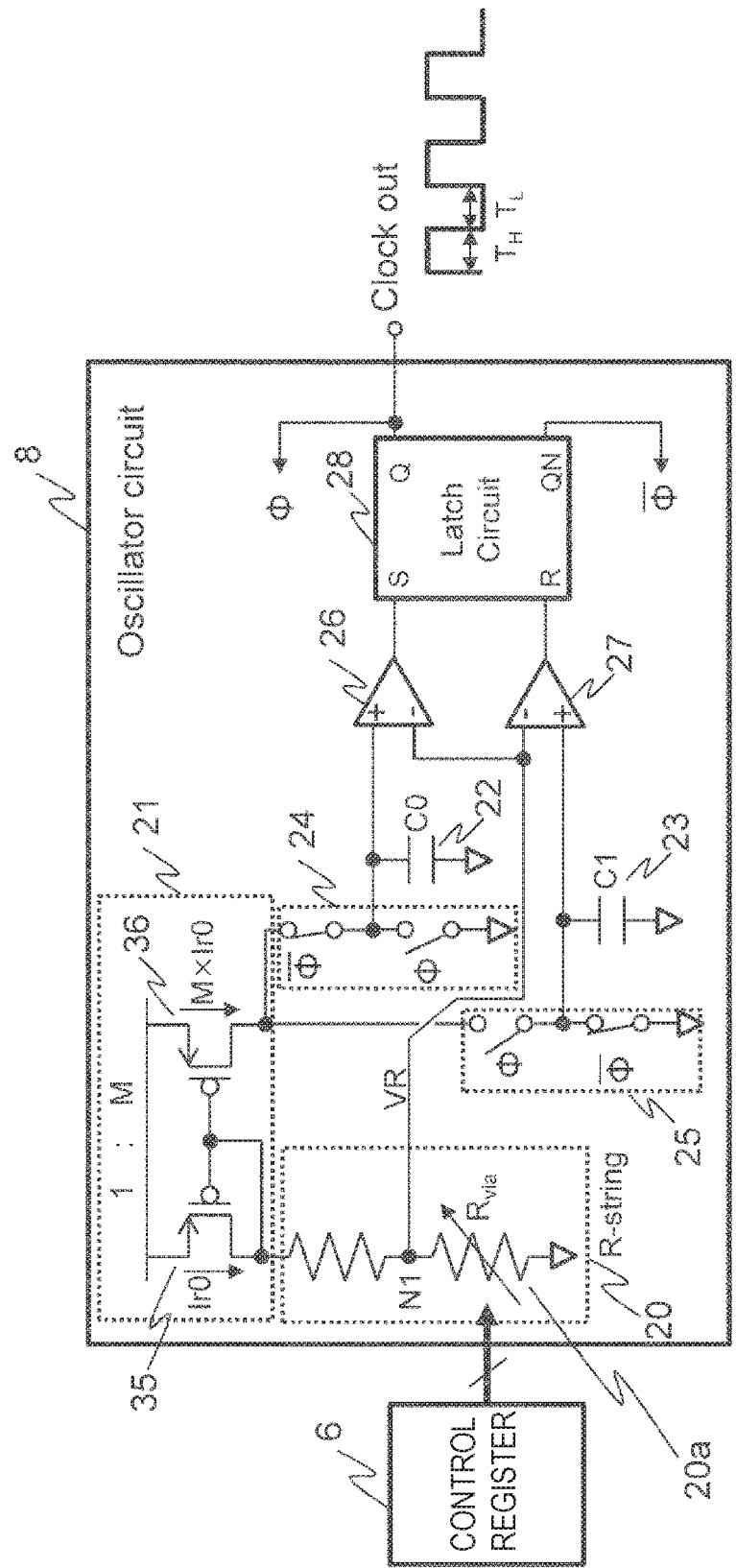
FIG. 2 is a circuit diagram of an oscillator circuit.

FIG. 2 shows a circuit diagram of an oscillation circuit 8 which is an example of an on-chip oscillator used in the clock generation circuit 7. The oscillation circuit includes a trimming circuit 20, a constant current generating circuit 21, capacitances 22 and 23, capacitor driving circuits 24 and 25, comparators 26 and 27, and a latch circuit 28. A current flowing through a source/drain path of a PMOS transistor 35 of the constant current generation circuit 21 is Ir0, and a transistor size of a PMOS transistor 36 of the constant current generation circuit 21 is M times a transistor size of the PMOS transistor 35. Therefore, the output current M×Ir0 is output from a drain of the PMOS transistor 36.

The oscillation output of the oscillation circuit 8 is an oscillation signal Φ output from the output terminal Q of the latch circuit 28. The latch circuit 28 has an output terminal QN, and an oscillation signal/Φ a phase opposite to that of the oscillation signal Φ is output from the output terminal QN. The oscillation signal Φ and the oscillation signal/Φ are inputted to the capacitor driving circuits 24 and 25, and the capacitors 22 and 23 are alternately charged with the output current M×Ir0 from the PMOS transistor 36 from the state of being discharged to a reference potential level. When this charge rises to a potential VR of a reference potential point N1 of the trimming circuit 20, the outputs of the comparators 26 and 27 are inverted, and the phase of the oscillation signal Φ (the oscillation signal/Φ) is inverted. By repeating this, the oscillation circuit 8 outputs the oscillation signals of a predetermined frequency.

In the trimming circuit 20, the potential VR of the reference potential point N1 is adjusted by adjusting the value of the resistance value Rvia of the variable resistor in accordance with the trimming code stored in the control register 6. From the following equation (1), it is understood that the oscillation frequency F(CKOUT) of the oscillation circuit 8 is determined by the capacitance values C0 and C1 of the capacitors 22 and 23, the resistance value Rvia of the variable resistor 20a, and the mirror ratio M. Let TH be the time width of the high level and TL be the time width of the low level in the oscillation outputs of the oscillation circuits 8.

[equation 1]

$$\begin{aligned} VR &= Ir0 \times R_{via} \\ M \times Ir0 \times T_H &= C0 \times VR \\ M \times Ir0 \times T_L &= C1 \times VR \\ F_{(CKOUT)} &= \frac{1}{T_H + T_L} = \frac{M \times Ir0}{(C0 + C1) \times VR} = \frac{M}{(C0 + C1) \times R_{via}} \end{aligned} \quad (1)$$

Figure 3:
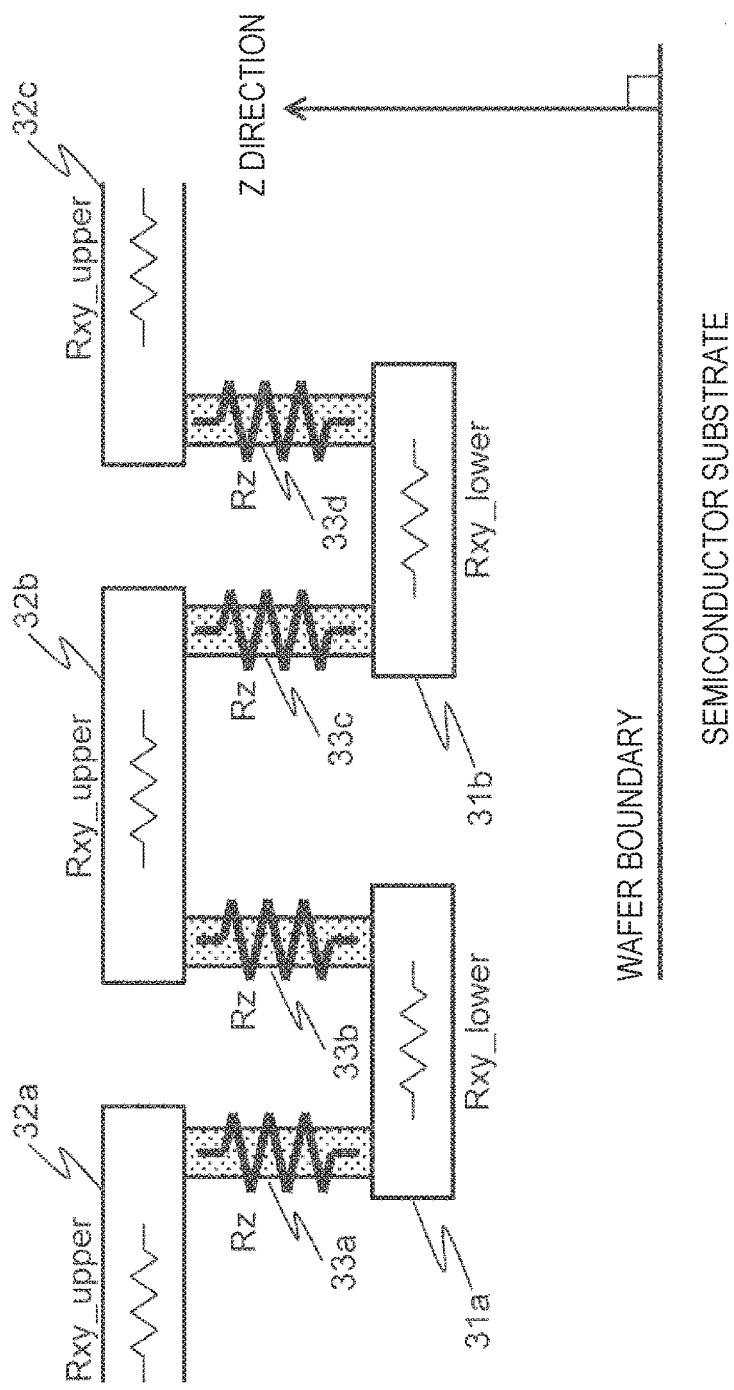
FIG. 3 is a conceptual diagram of a resistance element.

FIG. 3 is a conceptual diagram of a resistance element used in a variable resistor 20a according to the present embodiment. The resistance elements are formed in the wiring layers of the semiconductor device. The semiconductor substrate surface on which the semiconductor element is formed is defined as an XY plane, and the direction perpendicular to the XY plane is defined as a Z direction. The resistance element has a lower conductive layer 31 and an upper conductive layer 32 extending in the X direction or the Y direction, respectively, both ends thereof are connected to the lower conductive layer 31 and the upper conductive layer 32, respectively, and has an interlayer conductive layer 33 extending in the Z direction, and the lower conductive layer 31, the interlayer conductive layer 33, and the upper conductive layer 32 are connected in series.

Here, it is assumed that the resistance of the resistance element is R, and k+1 lower conductive layers 31, k upper conductive layers 32, and 2k interlayer conductive layers 33 of the resistance element are connected in series. A resistance value of one lower conductive layer 31 is Rxy_lower, a resistance value of one upper conductive layer 32 is Rxy_upper, and a resistance value of one interlayer conductive layer 33 is Rz. At this time, the resistance R of the resistance elements is expressed as R=(k+1)×Rxy_lower+2k×Rz+k×Rxy_upper.

This is an expression, in case of the resistance element is connected to another element in the upper conductive layer 32. Similarly, in case of the lower conductive layer 31 is connected to another element, the resistance value R of the resistance element is expressed as R=k×Rxy_lower+2k×Rz+(k+1)×Rxy_upper.

In either case, it is assumed that the Z-direction component of the resistance element is a main resistance, and a relationship of Rz>>Rxy_lower+Rxy_upper is established. The resistance elements of the present embodiment formed in the interconnect layers and having the Z-direction component as the main resistance are hardly affected by stresses generated in the semiconductor substrate by the mold packaging process. Therefore, there is no limitation on the arrangement position of the resistance element of the present embodiment, and the lower conductive layer 31, the interlayer conductive layer 33, and the upper conductive layer 32 may be connected in series so that the resistance element has a desired resistance, and there is no limitation on the arrangement and the number of individual conductive layers.

Figure 4:
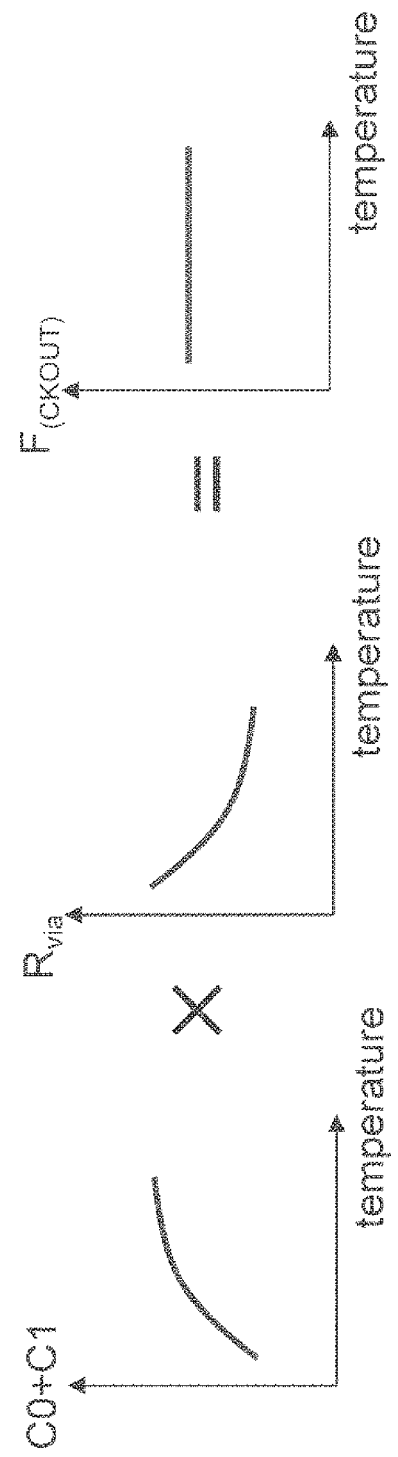
FIG. 4 is a diagram showing a principle of suppressing the temperature dependence of the oscillator frequency.

In particular, in the present embodiment, the interlayer conductive layer 33 serving as the main resistance is formed so that the resistance Rvia of the resistance element becomes equal to the inverse of the sum (C0+C1) of the capacitances of the resistance element. At this time, as shown in FIG. 4, if the product of (C0+C1) and the Rvia can be made a constant value regardless of the temperature, the oscillation frequency F(CKOUT) of the oscillation circuit 8 can be made constant regardless of the temperature, according to the relation shown in equation (1).

Figure 5:
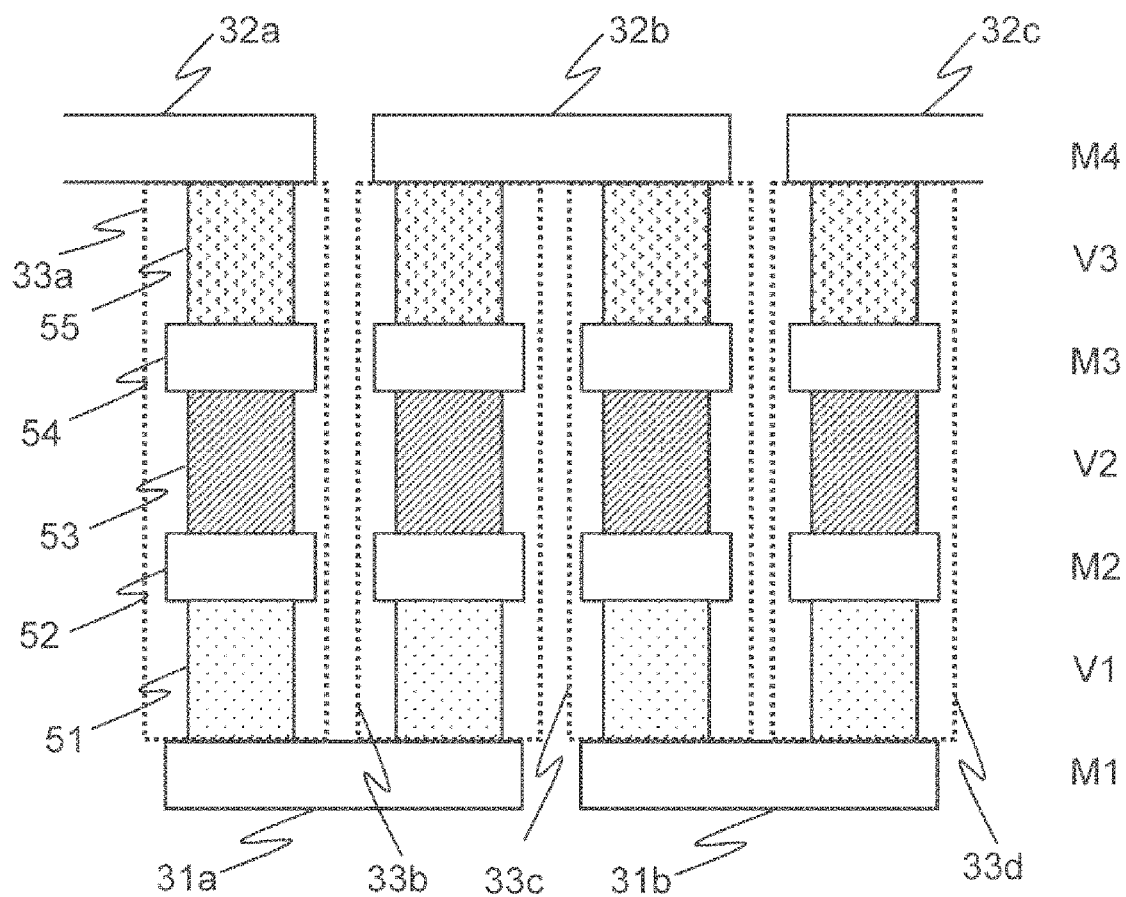
FIG. 5 is an example of a resistance element.

Specifically, for the interlayer conductive layer 33 constituting the main resistance of the resistance element used for the variable resistance 20a, the temperature dependence of the resistance Rvia of the resistance element is made equal to the inverse temperature dependence of (C0+C1) by using embedded vias of a plurality of different materials. Note that since the lower conductive layer 31 and the upper conductive layer 32 constituting the resistance element are wiring layers originally formed with low resistance, the influence of the lower conductive layer 31 and the upper conductive layer 32 can be reduced to a negligible degree. FIG. 5 shows a mounting example of the resistance element. As described above, the structures of the wiring layers formed in the semiconductor device are used for the resistance elements. The lower conductive layer 31 is formed in the wiring layer M1, the upper conductive layer 32 is formed in the wiring layer M4, and the interlayer conductive layer 33 is formed in the vias V1 to V3 and the wiring layers M2 and M3. By forming the interlayer conductive layer 33 with a plurality of conductive layers, the resistance value of the inter-layer conductive layer 33 can be increased as much as possible, and it can be formed without complicating the process of the wiring layer. The interlayer conductive layer 33 includes a via 51 connected in series, a landing pad 52 formed in the wiring layer M2, a via 53, a landing pad 54 formed in the wiring layer M3, and a via 55. In the resistance element of FIG. 5, it is assumed that the via 51 formed between the wiring layers M1 and M2 is formed of the material a, the via 53 formed between the wiring layers M2 and M3 is formed of the material b, and the via 55 formed between the wiring layers M3 and M4 is formed of the material c.

At this time, the capacitance C(=C0+C1), the resistance value Ra of the buried via of the material a, the resistance value Rb of the buried via of the material b, and the resistance value Rc of the buried via of the material c can be expressed as the following equation (2) and equation (3), where the temperature change is ΔT. All values shall be up to the second approximation.

[equation 2]

$$C = C_0\{1 + k_{TC1} \times \Delta T + k_{TC2} \times \Delta T^2\} \quad (2)$$

[equation 3]

$$\left.\begin{array}{l}Ra = Ra_0\{1 + k_{TRa1} \times \Delta T + k_{TRa2} \times \Delta T^2\} \\ Rb = Rb_0\{1 + k_{TRb1} \times \Delta T + k_{TRb2} \times \Delta T^2\} \\ Rc = Rc_0\{1 + k_{TRc1} \times \Delta T + k_{TRc2} \times \Delta T^2\}\end{array}\right] \quad (3)$$

Note that C0, Ra0, Rb0, and Rc0 are zeroth-order approximations, kTC1, kTRa1, kTRb1, and kTRc1 are primary temperature coefficients, and kTC2, kTRa2, kTRb2, and kTRc2 are secondary temperature coefficients, respectively.

Since the resistance value Rvia of the resistance element can be regarded as the resistance value of the interlayer conductive layer which is the main resistance, the resistance value Rvia can be expressed as the sum of the resistance values Ra, Rb, and Rc (Rvia=Ra+Rb+Rc). Substituting equation (3) into this gives equation (4).

[equation 4]

$$Rvia=(Ra_0+Rb_0+Rc_0)+(Ra_0 k_{TRa1}+Rb_0 k_{TRb1}+ \\ Rc_0 k_{TRc1})\times\Delta T+(Ra_0 k_{TRa2}+Rb_0 k_{TRb2}+Rc_0 k_{TRc2})\times \\ \Delta T^2 \quad (4)$$

Further, by substituting equation (2) and equation (4) into the equation of the oscillation frequency F(CKOUT) shown in equation (1), the following relation equation (5) is obtained.

[equation 5]

$$F_{(CKOUT)} = \frac{M}{C_0\{1 + k_{TC1} \times \Delta T + k_{TC2} \times \Delta T^2\} \times Rvia_0\{1 + k_{TR1} \times \Delta T + k_{TR2} \times \Delta T^2\}} = \frac{M}{C_0 \times Rvia_0} \times$$

$$\frac{1}{1 + (k_{TC1} + k_{TR1}) \times \Delta T + (k_{TC2} + k_{TR2} + k_{TC1} \times k_{TR1}) \times \Delta T^2 + (k_{TC2} \times k_{TR1} + k_{TC1} \times k_{TR2}) \times \Delta T^3 + k_{TC2} \times k_{TR2} \times \Delta T^4}$$

$$Rvia_0 = Ra_0 + Rb_0 + Rc_0$$

$$k_{TR1} = \frac{Ra_0 k_{TRa1} + Rb_0 k_{TRb1} + Rc_0 k_{TRc1}}{Rvia_0}$$

$$k_{TR2} = \frac{Ra_0 k_{TRa2} + Rb_0 k_{TRb2} + Rc_0 k_{TRc2}}{Rvia_0}$$

Here, since the temperature coefficient is smaller than 1 and the value of the coefficient becomes smaller as the temperature becomes higher, and the effect on the temperature dependency is small, a resistance element having extremely small temperature dependency can be obtained by adjusting the ratio of Ra0, Rb0, and Rc0 to Rvia0 so that the first-order temperature coefficient (kTC1+kTR1) and the second-order temperature coefficient (kTC2+kTR2+kTC1×kTR1) in the oscillation frequency F(CKOUT) become 0, respectively. This results in solving two equations each having three variables Ra0, Rb0 and Rc0 and having a first-order temperature coefficient and a second-order temperature coefficient of 0, so that the resistance elements having extremely low temperature dependency can be realized. For example, in case of the second-order temperature coefficient can be ignored from the accuracy of the oscillation frequency F(CKOUT), the interlayer conductive layer may be composed of two types of materials as the material of the resistance element, and conversely, in case of the high-order temperature coefficient is also 0, the interlayer conductive layer may be composed of a plurality of types of materials corresponding to the high-order temperature coefficient.

Since the resistance values Ra, Rb, and Rc of the respective materials are always positive values, at least one of the materials constituting the interlayer conductive layer needs to include a material having a positive temperature coefficient and at least one material having a negative temperature coefficient. As a material having such a negative temperature coefficient, a semiconductor (polysilicon) can be used. For example, although FIG. 5 shows an example in which the materials of the interlayer conductive layer 33 is different for each layer, titanium nitride (TiN) is used for the via 51, P-type polysilicon (P-PolySi) is used for the via 53, and a tungsten (W) is used for the via 55.

Figure 6:
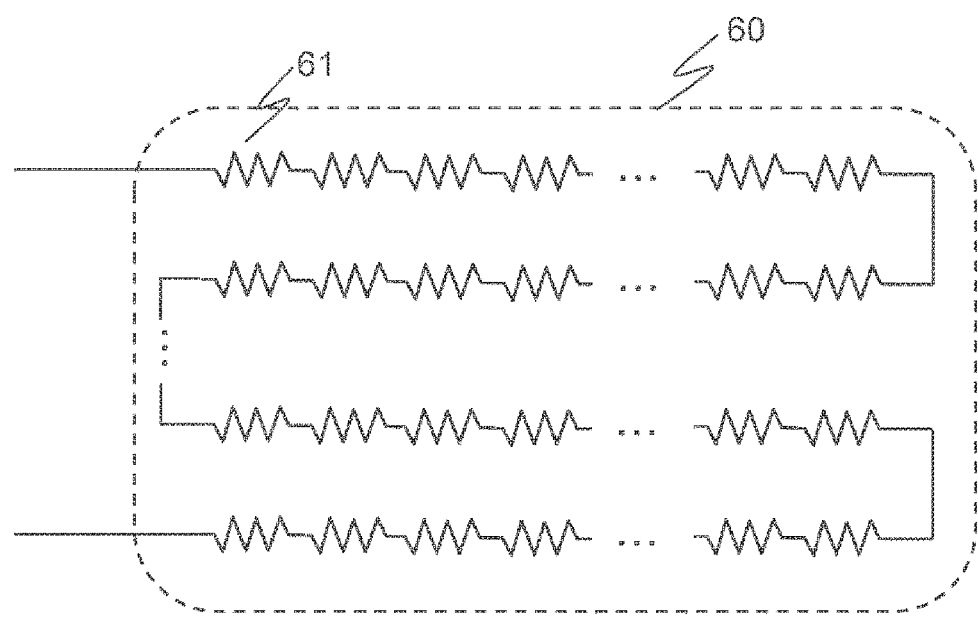
FIG. 6 is a circuit diagram of a resistance element.

As described above, since the variable resistor 20a in the present embodiment is formed by using the structures of the wiring layers, the resistance values of the individual conductive layers constituting the resistance elements are relatively low. Therefore, a desired resistance value is realized by using a large number of conductive layers connected in series as the resistance element. FIG. 6 is a circuit diagram showing the resistance element 60. Since the resistance element 60 is formed of a repetitive pattern of the lower conductive layer, the interlayer conductive layer, and the upper conductive layer, one unit of the repetitive pattern is pseudo-denoted herein as a unit resistor 61.

Figure 7:
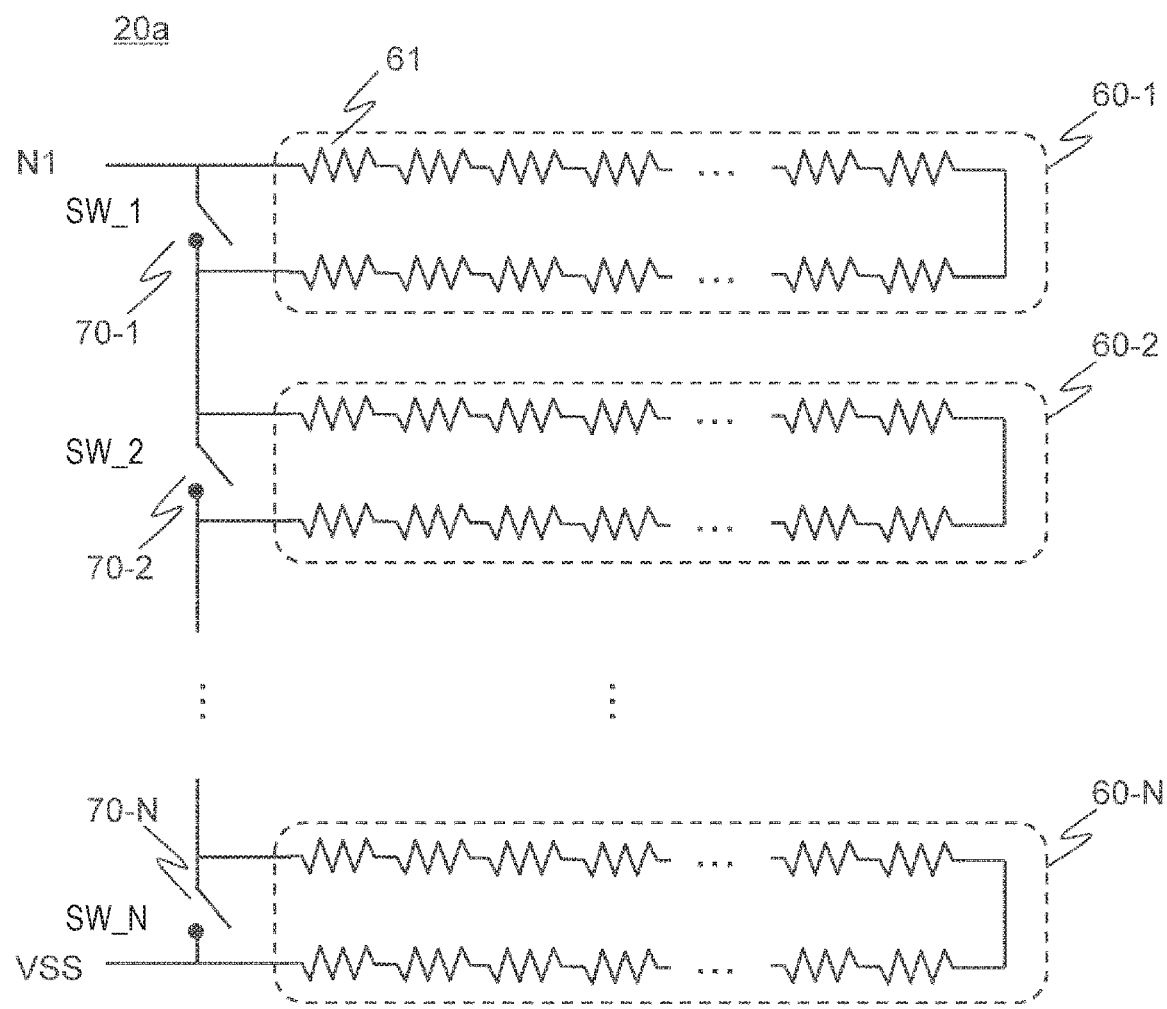
FIG. 7 is a circuit diagram of a variable resistance using a resistance element.

FIG. 7 is a circuit diagram of the variable resistor 20a using the resistance element 60 of the present embodiment. The variable resistor 20a has N resistance elements 60 connected in series, and a bypass switch 70-$i$ ($i$=1 to N) provided in parallel with the resistance element 60-$i$ to bypass the resistance element 60-$i$ ($i$=1 to N). As shown in FIG. 6, the resistance element 60 is composed of unit resistors 61 connected in series. The ON/OFF of the bypass switch 70-$i$ of the variable resistor 20a is determined according to the trimming code, whereby the resistance of the variable resistor 20a is set to a desired resistance value, and a potential corresponding to the resistance value appears at the node N1. Since the resistance elements 60 of the present embodiment have a large number of series elements, the yield may be deteriorated due to, for example, a defect due to non-conduction. For this reason, the corresponding bypass switch 70-$i$ is constantly turned on for the resistance element 60-$i$ in which the manufacturing failure has occurred, whereby the yield degradation can be prevented.

Although FIG. 5 shows an example in which buried vias of different materials are vertically stacked to form an interlayer conductive layer as the resistance element 60, the present invention is not limited thereto. Other implementations are illustrated below.

Figure 8:
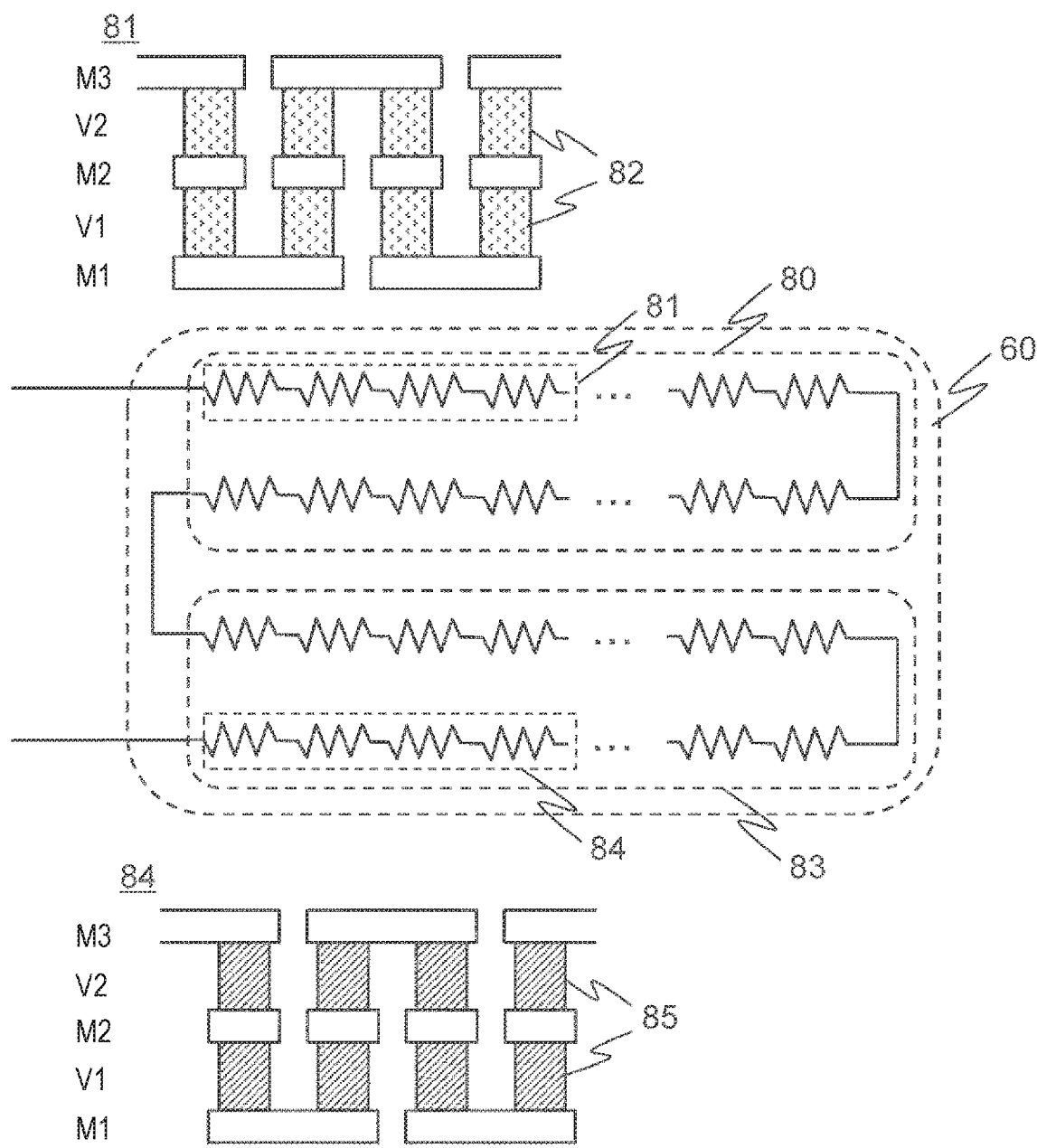
FIG. 8 is a diagram showing an example of a resistance element.
Figure 9:
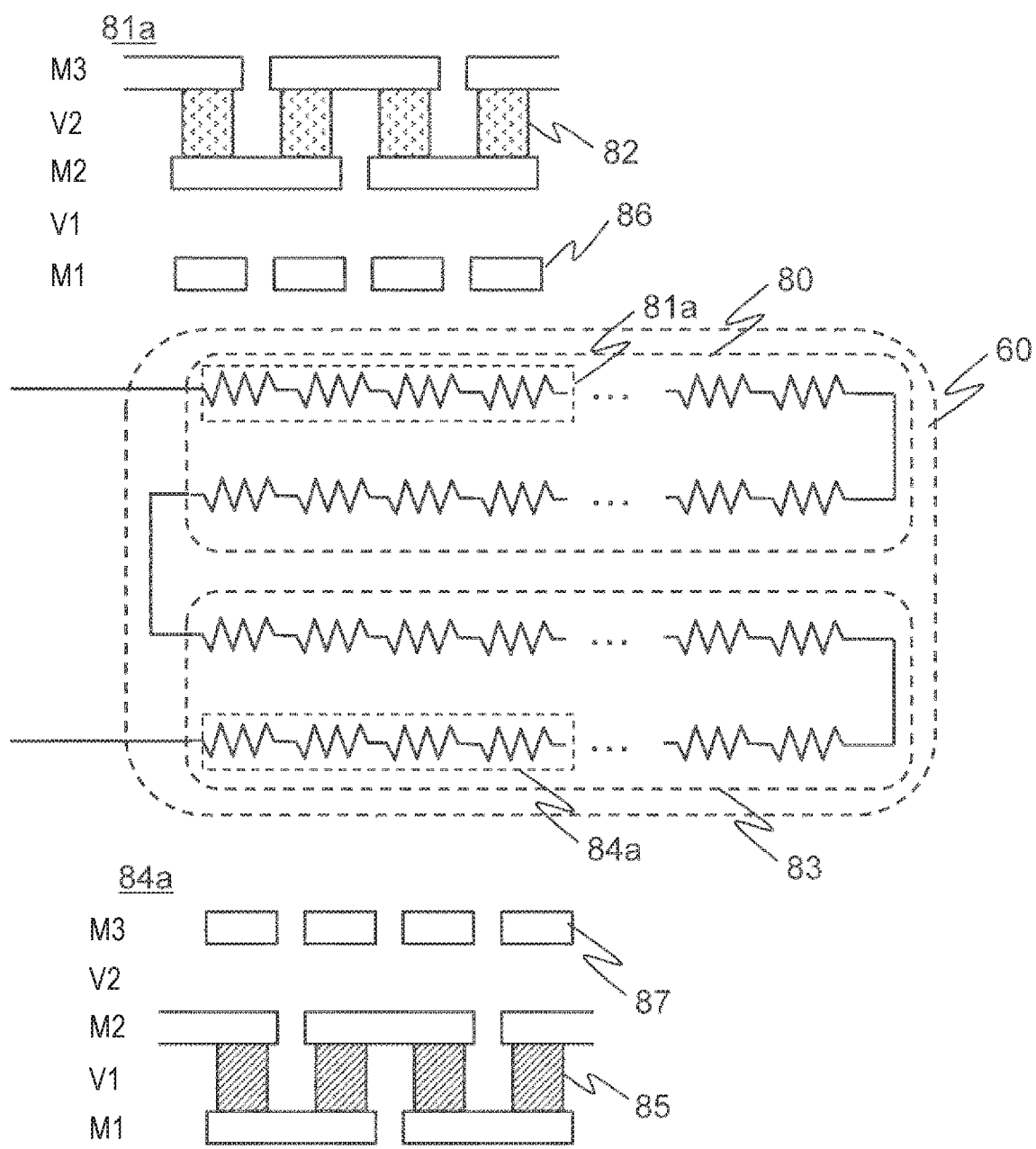
FIG. 9 is a diagram showing example of a resistance element.

In FIG. 8, the resistance element 60 is divided into a plurality of areas, and the materials for forming the interlayer conductive layers in the respective areas are different from each other. In this example, it is separated into two areas 80 and 83. As shown in the cross-sectional view of the portion 81 of the resistance element formed in the area 80, W is used for the via 82 of the area 80, and as shown in the cross-sectional view of the portion 84 of the resistance element formed in the area 83, P-PolySi is used for the via 85 of the area 83. FIG. 9 shows the modified example. In this example, the layer for forming the buried via is different depending on the material. As shown in the cross-sectional view of the part 81a of the resistance elements formed in the area 80, W is used for the via 82 in the area 80, but the W buried via is formed between the wiring layer M2 and the wiring layer M3, and is not formed between the wiring layer M1 and the wiring layer M2. On the other hand, as shown in the cross-sectional view of the part 84a of the resistance elements formed in the area 83, although P-PolySi is used for the via 85 in the area 83, the P-PolySi buried via is formed between the wiring layer M1 and the wiring layer M2, and is not formed between the wiring layer M2 and the wiring layer M3. As described above, by making the layer for forming the buried via different depending on the material, there is an advantage that the process for forming the resistance element 60 can be simplified. In this example, a dummy wiring 86 and a dummy wiring 87 are provided in the wiring layer in which no buried via is formed, that is, in the wiring layer M1 in the area 80 and in the wiring layer M3 in the area 83, respectively. The dummy wiring may be omitted.

Figure 10:
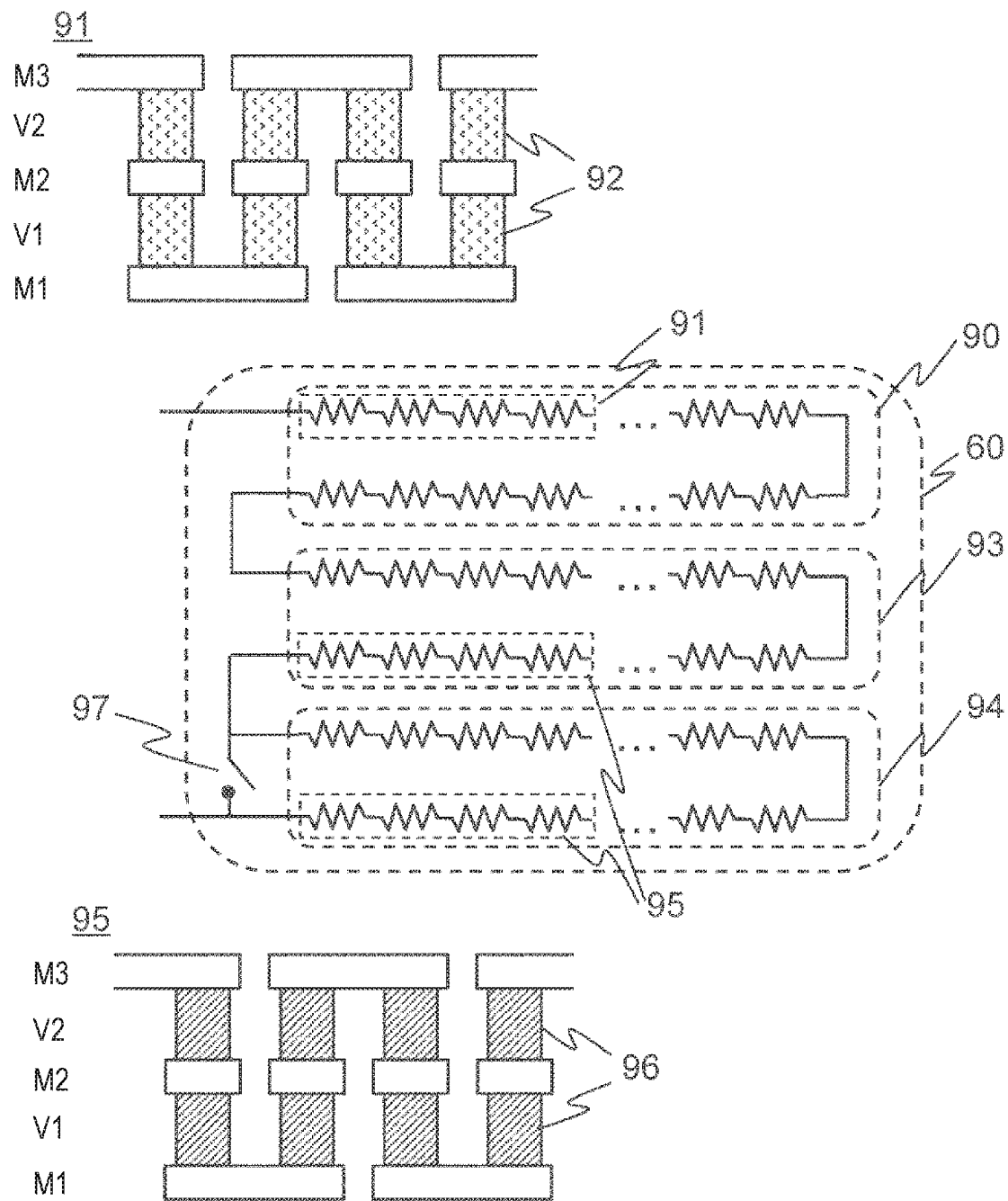
FIG. 10 is a diagram showing example of a resistance element.

FIG. 10 shows a configuration example of the resistance element 60 shown in FIG. 8 in which a correction block for correcting the temperature coefficient is provided. The unit resistor configured in the area 90, the unit resistor configured in the area 93, and the unit resistor configured in the area 94 are connected in series, and a bypass switch 97 is provided in parallel with the unit resistor connected in series in the area 94. In addition, as shown in the cross-sectional view of the part 91 of the resistance element formed in the area 90, W is used for the via 92 of the area 90, and as shown in the cross-sectional view of the part 95 of the resistance element formed in the area 93 and the area 94, P-PolySi is used for the via 96 of the area 93 and the area 94. According to this configuration, in case of variations occur in the thermal coefficients due to device variations, by switching the ON/OFF of the by-pass switch 97, variations can be suppressed, and the frequency accuracy can be improved. Although this example shows an example in which a correction block is provided in which a material having a negative temperature coefficient is used as an interlayer conductive layer, a correction block in which a material having a positive temperature coefficient is used as an interlayer conductive layer may be provided, or both a correction block in which a material having a positive temperature coefficient is used as an interlayer conductive layer and a correction block in which a material having a negative temperature coefficient is used as an interlayer conductive layer may be provided. The number of series of unit resistors in the correction block may be the same as or different from the number of series in other areas.

Figure 11:
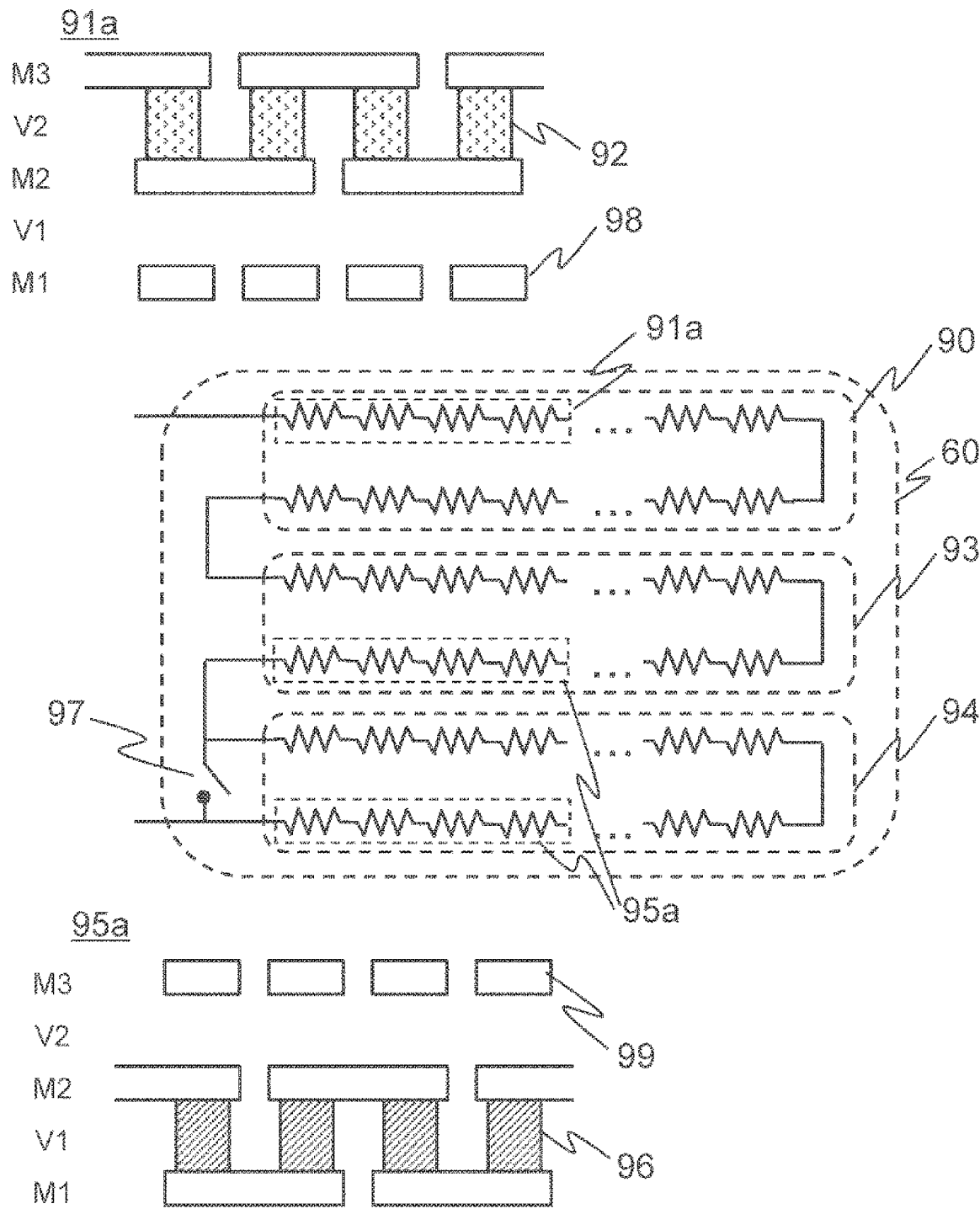
FIG. 11 is a diagram showing example of a resistance element.

FIG. 11 shows an example in which the layer for forming the buried via is made different depending on the material, similarly to the example of FIG. 9. There is an advantage that the process of forming the resistance element 60 can be simplified.

Figure 12:
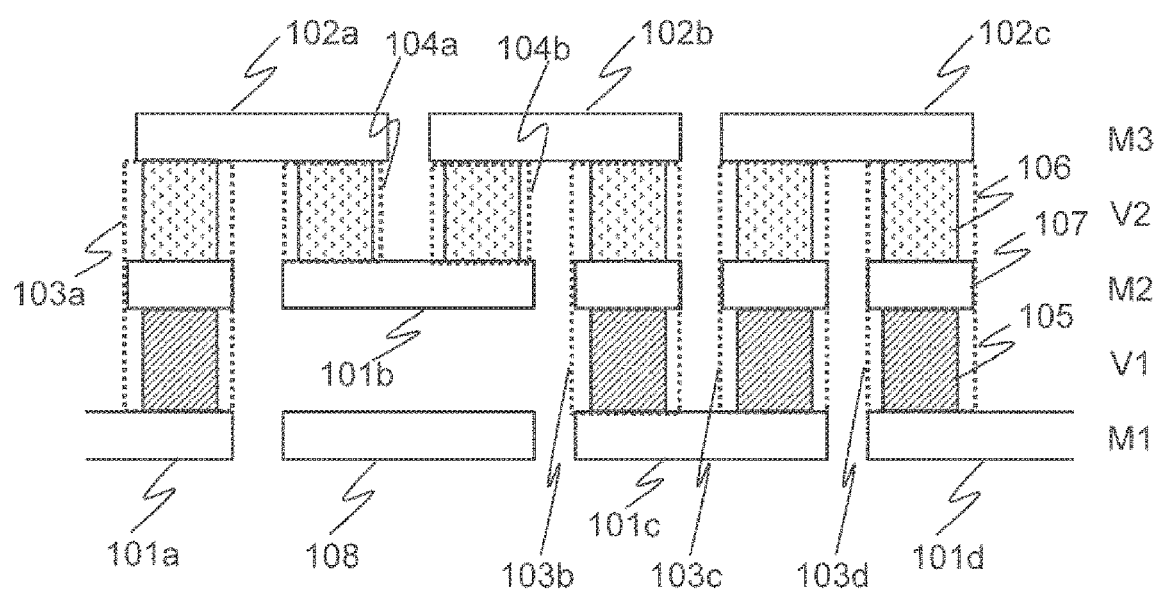
FIG. 12 is a diagram showing example of a resistance element.

FIG. 12 shows a modified example in which interlayer conductive layers are formed by vertically stacking resistors of differing materials. In case of the material for forming the interlayer conductive layer is made different for each area as shown in FIGS. 8 to 11, the ratio of the Ra0, the Rb0, and the Rc0 to the Rvia0 can be accurately adjusted by making the number of unit resistance elements connected in series different for each area in addition to the resistance values inherent to the material. FIG. 12 shows that the same can be done even in case of buried vias of different materials are vertically stacked to form the interlayer conductive layer. In this embodiment, the interlayer conductive layer is formed of the P-PolySi buried via 105 and the W buried via 106, and the number of vias 105 and the number of vias 106 are different from each other.

In this example, the lower conductive layer 101 is formed in the wiring layer M1 or the wiring layer M2, the upper conductive layer 102 is formed in the wiring layer M3, and the interlayer conductive layer 103 is formed in the vias V1 to V2 and the wiring layer M2. For example, the interlayer conductive layer 103a is composed of the via 105 connected in series, a landing pad 107 formed in the wiring layer M2, and the via 106, whereas the interlayer conductive layers 104a and 104b are composed of the via 106 and connected to the lower conductive layer 101b formed in the wiring layer M2. In this example, a dummy wiring 108 may or may not be provided in the wiring layer M1 in which the embedded via 105 is not formed. This example is an example in which the number of the P-PolySi buried vias 105 is reduced, but the number of the W buried vias 106 can also be reduced. Although this example is an example having embedded vias of two types of materials, the number of embedded vias for each material can be adjusted similarly in an example having embedded vias of two or more types of materials as shown in FIG. 5.

Figure 13:
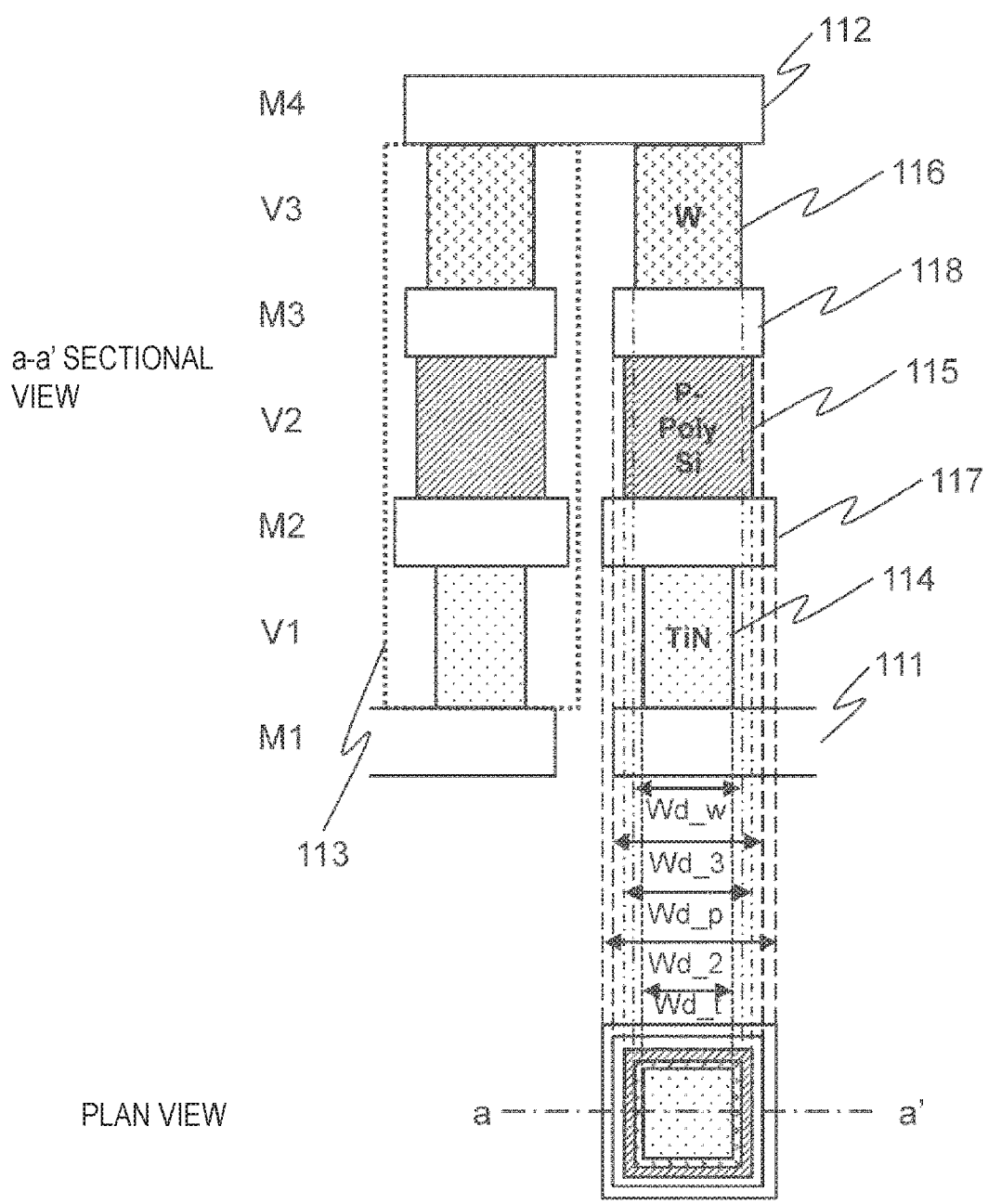
FIG. 13 is a diagram showing example of a resistance element.

FIG. 13 shows still another modified example. FIG. 11 shows a sectional view in an a-a' shown in planar view and plan view of an interlayer conductive layer 113 formed between wiring layers M1 to M4. The interlayer conductive layer 113 includes a TiN-buried via 114 connected in series, a landing pad 117 formed in the wiring layer M2, a P-PolySi buried via 115, a landing pad 118 formed in the wiring layer M3, and a W-buried via 116. In this example, the diameter of each via and the diameter of the landing pad are made different. Specifically, in case of the diameter Wd_t of the TiN-buried via 114, the diameter Wd_2 of the landing pad 117, the diameter Wd_p of the P-PolySi buried via 115, the diameter Wd_3 of the landing pad 118, and the diameter Wd_w of the W-buried via 116 are set to Wd_t<Wd_w<Wd_p<Wd_3<Wd_2. In this manner, by making the diameters of the vias of different materials different from each other, the ratio of the Ra0, the Rb0, and the Rc0 to the Rvia0 can be accurately adjusted in addition to the resistive values inherent to the materials. Further, the TiN-buried via 114 and the P-PolySi buried via 115, or the P-PolySi buried via 115 and the W-buried via 116 may be directly connected without using the landing pads.

Figure 14:
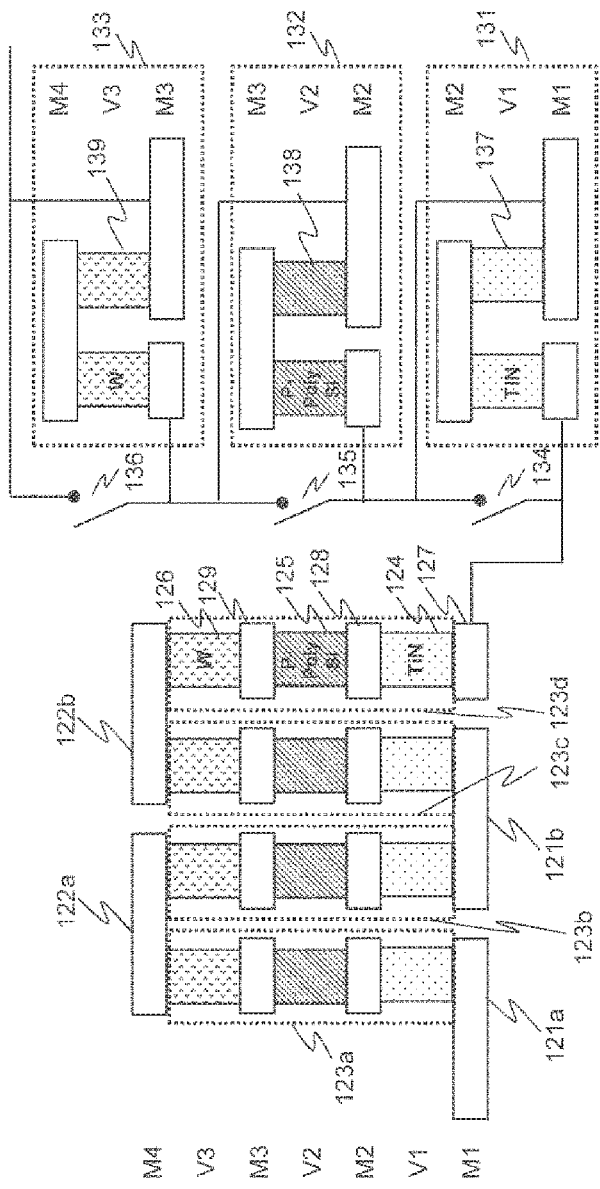
FIG. 14 is a diagram showing example of a resistance element.

FIG. 14 shows an example in which a correction block for correcting the temperature coefficient is provided for a resistance element in which the interlayer conductive layers are formed by vertically stacking resistors of different materials. In this example, the correction blocks 131 to 133 connected to the interlayer conductive layer 123d provided between the upper conductive layer 122b formed in the wiring layer M4 and a landing pad 127 formed in the wiring layer M1, and bypass switches 134 to 136 connected in parallel to the correction blocks 131 to 133, respectively, are provided. The correction blocks 131 to 133 are connected in series to the resistance elements. The correction block 131 is composed of a conductive layer of the wiring layer M1, a conductive layer of the wiring layer M2, and an interlayer conductive layer 137 between the wiring layers M1 and M2, and the interlayer conductive layer 137 is made of the same material as the via 124 of the interlayer conductive layer 123 (here, TiN). The correction block 132 is composed of the conductive layer of the wiring layer M2, the conductive layer of the wiring layer M3, and the interlayer conductive layer 138 between the wiring layers M2 and M3, and the material of the interlayer conductive layer 138 is the same as that of the via 125 of the interlayer conductive layer 123 (here, P-PolySi). The correction block 133 is composed of the conductive layer of the wiring layer M3, the conductive layer of the wiring layer M4, and the interlayer conductive layer 139 between the wiring layers M3 and M4, and the material of the interlayer conductive layer 139 is the same as that of the via 126 of the interlayer conductive layer 123 (here, W). According to this configuration, in case of a variation occurs in the thermal coefficients due to a variation in the elements, the variation can be suppressed by switching the ON/OFF of the bypass switches 134 to 136, and the frequency accuracy can be improved. In this example, an example is shown in which correction blocks corresponding to all the materials of the interlayer conductive layers constituting the resistance element are provided, but correction blocks corresponding to one type or two types of materials may be provided.

Figure 15:
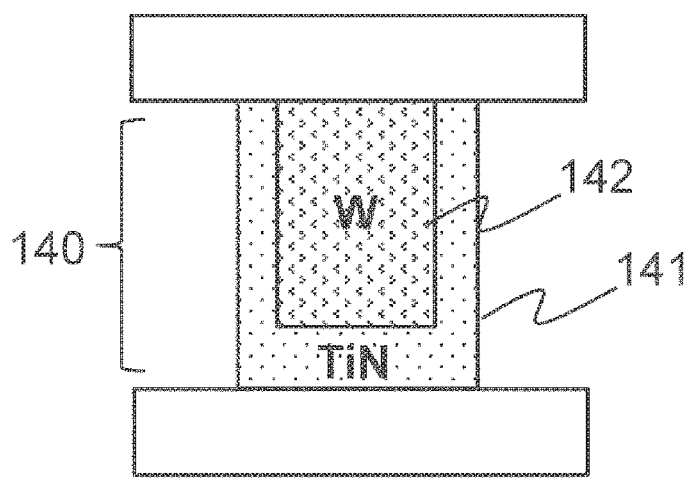
FIG. 15 is a diagram showing an example of a multilayer embedded via.

Although various examples of mounting the resistance element 60 have been described above, materials other than the materials exemplified can be used for these materials, and different resistive materials can be buried in multiple layers in the same via as shown in FIG. 15. The via 140 has a structure in which a TiN layer 141 is deposited and a W layer 142 is buried. In this manner, vias having a plurality of materials may be formed between one wiring layer instead of forming vias having different materials between the wiring layers.

The formation of the resistance component in the direction perpendicular is not limited to the method of embedding the resistance material by drilling a hole in the interlayer insulating film, and may be a formation method of forming the interlayer insulating film after the necessary pattern is etched using a mask to form the conductive layer pattern on the conductive layer formed by previously depositing the resistance material.

Figure 16:
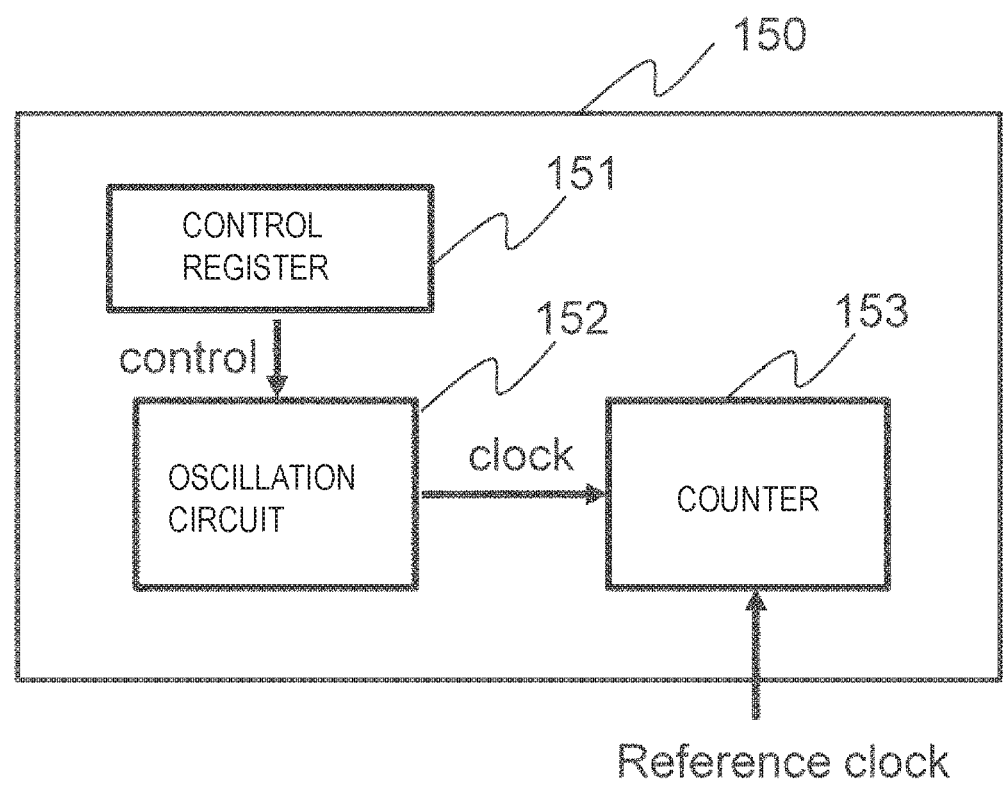
FIG. 16 is a block diagram of a pressure sensor.

As described above, the resistance elements of the present embodiment can suppress the influence of stresses and the influence of thermal changes generated in the semiconductor substrate by the mold packaging process. As an application utilizing these characteristics, FIG. 16 shows a pressure sensor 150 using the resistance elements of the present embodiment.

The pressure sensor 150 includes a control register 151, an oscillation circuit 152, and a counter 153. Based on the control signal read from the control register 151, the oscillation circuit 152 oscillates a clock having a predetermined oscillation frequency. The counter 153 counts the number of cycles of the clock from the oscillation circuit 152 in a period determined by reference clocks. The pressure sensor 150 is a pressure sensor using a stress variation of a resistance element, which is a common type of pressure sensor. As the oscillation circuit 152, for example, an oscillation circuit as shown in FIG. 2 can be used. When pressure is applied to the pressure sensor 150, the resistance value of the resistance element included in the oscillation circuit 152 changes, and the frequency of the clock from the oscillation circuit 152 changes accordingly. The counter 153 detects the pressure applied to the pressure sensor 150 from a change in the frequency of the clock, that is, a change in the number of cycles to be counted. In the conventional resistance element, since the resistance value also changes depending on the temperature, it is necessary to incorporate a temperature sensor and correct the variation caused by the temperature change. The use of the resistance elements of the present embodiment eliminates the need for thermal sensors.

Here, it is desirable that the resistance element used for the pressure sensor used in the oscillation circuit 152 has a large resistance value which changes due to the application of pressure to the pressure sensor 150.

Figure 17:
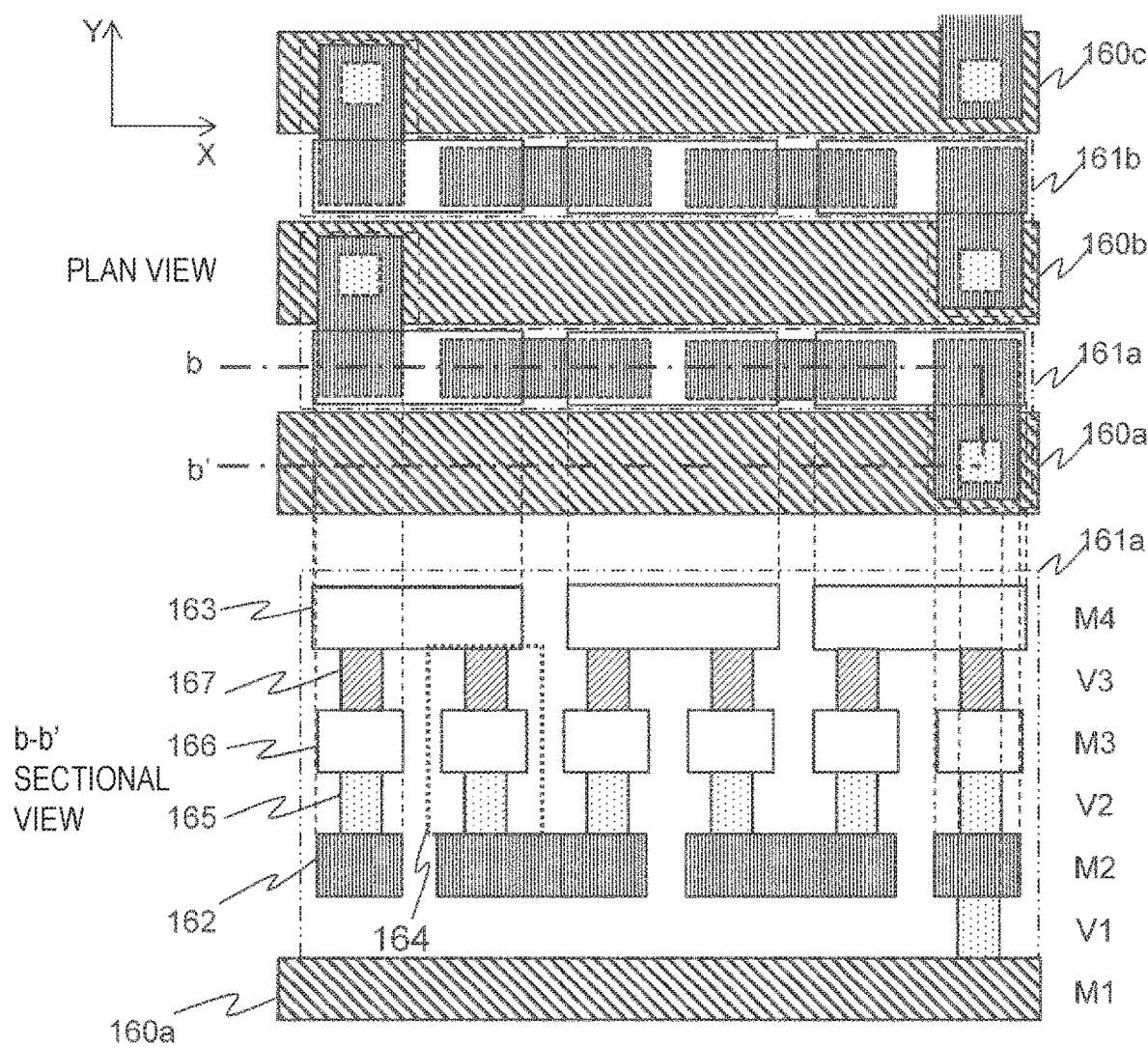
FIG. 17 is a diagram showing example of a resistance element.

FIG. 17 shows an example of a resistance element. Pressure-sensitive conductive layers 160a to 160c extending in the X-direction of the wiring layer M1 are arranged in parallel. Pressure-sensitive conductive layers 160 are formed of a material whose resistivity is easily changed by stresses applied to the chips, for example, SiCr. The pressure-sensitive conductive layer 160 is connected in series via a connection portion 161. The connecting portion 161 is formed by using a structure of a wiring layer. The lower conductive layer 162 is formed in the wiring layer M2, the upper conductive layer 163 is formed in the wiring layer M4, and the interlayer conductive layer 164 is formed in the vias V2 to V3 and the wiring layer M3. The interlayer conductive layer 164 includes a via 165 connected in series, a landing pad 166 formed in the wiring layer M3, and a via 167. The connection portion 161 is connected to the pressure-sensitive conductive layer 160 at a via V1 between the wiring layers M1 and M2 at one end and is connected to the adjacent pressure-sensitive conductive layer 160 at a via V1 between the wiring layers M1 and M2 at the other end.

In the resistance elements of FIG. 17, the via 165 formed between the wiring layers M2 and M3 is formed of the material a, the via 167 formed between the wiring layers M3 and M4 is formed of the material b, and the pressure-sensitive conductive layer 160 is formed of the material c, and the ratios of Ra0, Rb0, and Rc0 to Rvia0 are adjusted so that the first-order temperature coefficient (kTC1+kTR1) and the second-order temperature coefficient (kTC2+kTR2+kTC1×kTR1) at the oscillation frequency F(CKOUT), as shown in equation (5), become 0, respectively. As a result, in the resistance element shown in FIG. 17, a large resistance change due to stress can be obtained by the pressure-sensitive conductive layer 160, and on the other hand, by canceling the change in the temperature characteristic of the pressure-sensitive conductive layer 160 by the connecting portion 161, the influence due to the temperature change can be suppressed to a small degree.

In the example of FIG. 17, the pressure-sensitive conductive layer 160 is formed in a wiring layer lower than the wiring layer in which the connection portion 161 is formed, but the pressure-sensitive conductive layer 160 may be formed in a wiring layer higher than the wiring layer in which the connection portion 161 is formed.

Figure 18:
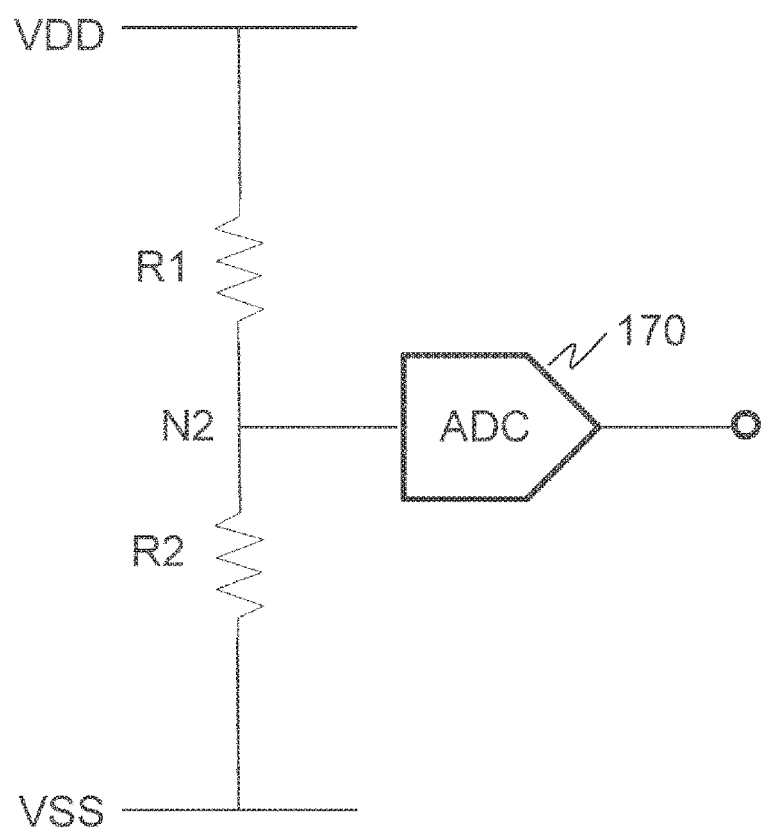
FIG. 18 is a diagram showing an example of a pressure detection circuit.

The pressure sensor is not limited to the configuration of FIG. 16. FIG. 18 shows an example of the pressure detection circuit. The A/D converter 170 detects the potential at the potential point N2 obtained by dividing the power supply voltage by the first resistor R1 and the second resistor R2.

Figure 19:
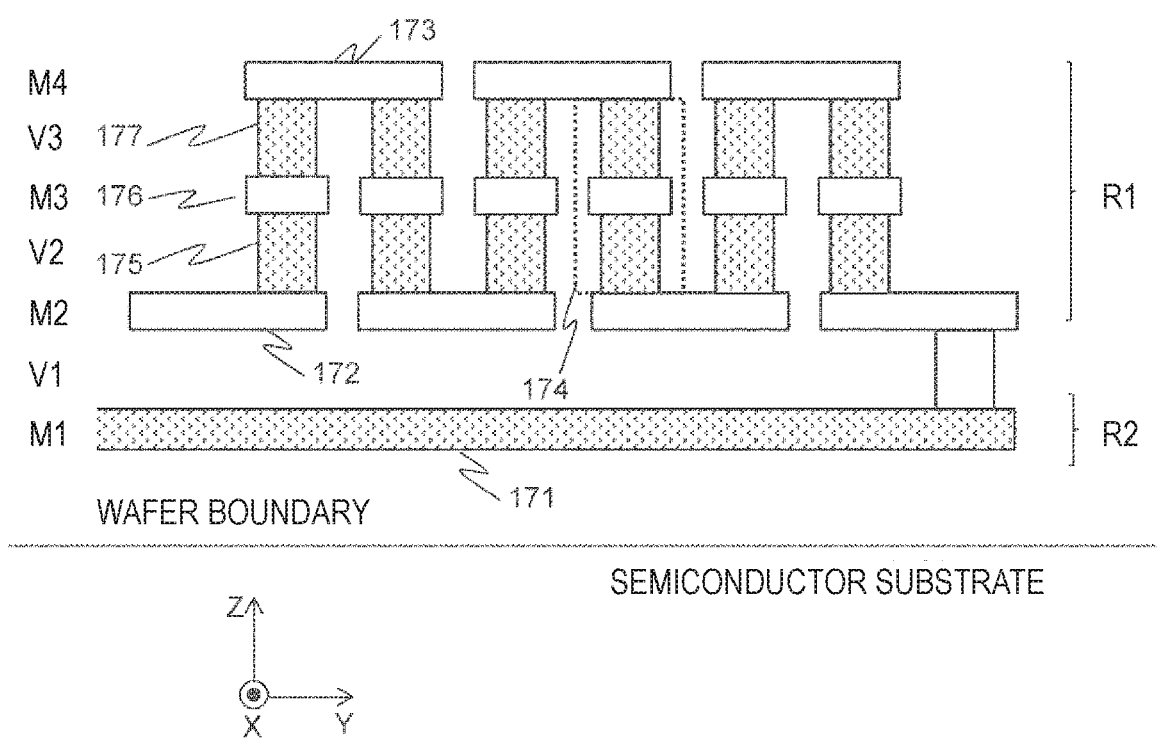
FIG. 19 is a diagram showing an example of a resistor for use in a pressure detection circuit.

FIG. 19 shows an example of mounting the first resistor R1 and the second resistor R2 used in the pressure detection circuit of FIG. 18.

The second resistor R2 is formed in the wiring layer M1 as the pressure-sensitive conductive layer 171 extending in the Y direction. The material of the pressure-sensitive conductive layer 171 is a material that generates a piezo-effect on the wafer. Specifically, the crystallographic point group is a material (1, 2, m, 222, mm2, 4, −4, 422, 4 mm, −42 m, 3, 32, 3 m, 6, −6, 622, 6 mm, −62 m, −23, −43 m), for example W can be used.

The first resistor R1 is formed by using the structure of the wiring layer. The lower conductive layer 172 is formed in the wiring layer M2, the upper conductive layer 173 is formed in the wiring layer M4, and the interlayer conductive layer 174 is formed in the vias V2 to V3 and the wiring layer M3. The interlayer conductive layer 174 includes a via 175 connected in series, a landing pad 176 formed in the wiring layer M3, and a via 177. The first resistor R1 and the second resistor R2 are connected to the via V1 between the wiring layers M1 and M2, and this connection point corresponds to the potential point N2 shown in FIG. 18.

The pressure-sensitive conductive layer 171 constituting the second resistor R2 and the vias 175 and 177 constituting the interlayer conductive layer which is the main resistor of the first resistor R1 are formed of the same material. As a result, the second resistor R2 is subjected to stress to generate a piezo-effect, while the interlayer conductive layer 174 of the first resistor R1 is hardly affected by the stress on the XY plane. On the other hand, since the pressure-sensitive conductive layer of the second resistor R2 and the interlayer conductive layer which is the main resistor of the first resistor R1 are formed of the same material, the change in the temperature characteristic due to the temperature variation is canceled out. This makes it possible to realize a pressure detection circuit in which the influence of temperature fluctuation is suppressed to a small level.

The pressure-sensitive conductive layer 171 in FIG. 19 is a conductive layer extending in the Y direction, but may be formed as a conductive layer extending in the X direction. Further, by providing both the pressure detection path circuit in which the conductive layer extending in the Y direction is the pressure-sensitive conductive layer 171 and the pressure detection path circuit in which the conductive layer extending in the X direction is the pressure-sensitive conductive layer 171 on one chip, a pressure sensor capable of detecting the pressure in the two-axis directions can be realized.

As yet another application of the resistance elements of the present embodiment, thermal sensors may be implemented using the circuitry of FIG. 16. Although the base voltage (Vbe) of the bipolar transistor is generally used for the temperature sensor, since the base voltage has a second-order temperature coefficient, the INL (integration non-linearity: Integral Nonlinearity) of the temperature sensor is degraded and a temperature error is liable to occur. Therefore, in the circuit block of FIG. 16, for example, the oscillation circuit of FIG. 2 is applied as the oscillation circuit 152, and the configuration of FIG. 5 is applied as the resistance element thereof. At this time, in the resistance element of FIG. 5, the via 51 formed between the wiring layers M1 and M2 is formed of the material a, the via 53 formed between the wiring layers M2 and M3 is formed of the material b, and the via 55 formed between the wiring layers M3 and M4 is formed of the material c, and the ratio of the Ra0, Rb0, and Rc0 to the Rvia0 is adjusted so that the secondary temperature coefficient (kTC2+kTR2+kTC1×kTR1) in the oscillation frequency F(CKOUT) becomes 0 as shown in equation (5). Since the resistance value of the resistance element is adjusted so that the second-order temperature coefficient is 0 and only the first-order temperature coefficient remains, the temperature sensor with good INL can be realized by counting the clock of the oscillation circuit 152. Since only the second-order temperature coefficient is set to 0, the interlayer conductive layer which is the main resistance of the resistance element may be formed of two types of materials.

Although the invention made by the present inventor has been specifically described based on the embodiment, the present invention is not limited to the embodiment described above, and it is needless to say that various modifications can be made without departing from the gist thereof. The materials illustrated are also exemplary only, and other materials that meet the requirements set forth in this embodiment may be used. The plurality of configuration examples and the plurality of configuration examples and the plurality of configuration examples and the plurality of configuration examples modified example can be used in combination as long as they do not conflict with each other.

Supplementary Note 1

A semiconductor device comprising:

a semiconductor substrate;

a plurality of wiring layers formed over the semiconductor substrate and including a first wiring layer, a second wiring layer and a third wiring layer; and an A/D converter detecting a potential of a potential point obtained by resistively dividing a power supply voltage by a first resistor and a second resistor, wherein the first resistor includes a repetitive pattern containing a first conductive layer formed in the first wiring layer, a second conductive layer formed in the second wiring layer, and an interlayer conductive layer connecting the first conductive layer and the second conductive layer, wherein the second resistor is formed in the third wiring layer, and wherein the material of the second resistor and the material of interlayer conductive layer of the first resistor are materials that piezo-effect occurs with respect to the semiconductor substrate.

Supplementary Note 2

The semiconductor device according to supplementary note 2, wherein the material includes crystallographic point group which including (1, 2, m, 222, mm2, 4, −4, 422, 4 mm, −42 m, 3, 32, 3 m, 6, −6, 622, 6 mm, −62 m, 23, −43 m).

Supplementary Note 3

The semiconductor device according to supplementary note 2, wherein the material is a tungsten.

What is claimed is:

1. A semiconductor device comprising:

a semiconductor substrate;

a plurality of wiring layers formed over the semiconductor substrate, the plurality of wiring layers including at least i) a first wiring layer, ii) a second wiring layer, and iii) a third wiring layer disposed between the first wiring layer and the second wiring layer; and a resistance element formed in the wiring layers, wherein the resistance element includes a first pattern of i) a first conductive layer formed in the first wiring layer, ii) a second conductive layer formed in the second wiring layer, and iii) a first interlayer conductive layer connecting the first conductive layer to the second conductive layer, wherein the first interlayer conductive layer includes a landing pad formed in the third wiring layer, a first via coupling the first conductive layer to the landing pad, and a second via coupling the second conductive layer to the landing pad, wherein the first via of the first interlayer conductive layer is formed by one of a material of positive temperature coefficient and a material of negative temperature coefficient, wherein the second via of the first interlayer conductive layer is formed by another one of the material of positive temperature coefficient and the material of negative temperature coefficient, and wherein, in plan view, a width of the first via, a width of the second via, and a width of the landing pad differ from one another.

2. The semiconductor device according to claim 1,
wherein the resistance element is formed in a first area and a second area,
wherein the resistance element formed in the first area, and the resistance element formed in the second area are coupled in series, and
wherein a material of the first interlayer conductive layer formed in the first area is different from a material of the first interlayer conductive layer formed in the second area.

3. The semiconductor device according to claim 2,
wherein the resistance element is formed in a third area,
wherein the resistance element formed in the first area, the resistance element formed in the second area, and the resistance element formed in the third area are coupled in series,
wherein the resistance element formed in the third area is provided in parallel with a bypass switch, and
wherein a material of the first interlayer conductive layer formed in the third area is same as the material of the first interlayer conductive layer formed in the first area or the material of the first interlayer conductive layer formed in the second area.

4. The semiconductor device according to claim 3,
wherein when the material of the first interlayer conductive layer formed in the third area is same as the material of the first interlayer conductive layer formed in the first area, the first interlayer conductive layer formed in the third area is formed between the first wiring layer and the second wiring layer, and which is not formed between the second wiring layer and the third wiring layer, and
wherein when the material of the first interlayer conductive layer formed in the third area is same as the material of the first interlayer conductive layer formed in the second area, the first interlayer conductive layer formed in the third area is formed between the second wiring layer and the third wiring layer, and which is not formed between the first wiring layer and the second wiring layer.

5. The semiconductor device according to claim 2,
wherein the first interlayer conductive layer formed in the first area is formed between the first wiring layer and the second wiring layer, and is not formed between the second wiring layer and the third wiring layer, and
wherein the first interlayer conductive layer formed in the second area is formed between the second wiring layer and the third wiring layer and is not formed between the first wiring layer and the second wiring layer.

6. The semiconductor device according to claim 1,
wherein the resistance element further includes:

a second pattern having the first conductive layer, a third conductive layer formed in the third wiring layer, and a second interlayer conductive layer connected to the first conductive layer and the third conductive layer; or a third pattern having the second conductive layer, the third conductive layer, and a third interlayer conductive layer connected to the second conductive layer and the third conductive layer.

7. The semiconductor device according to claim 1, further comprising at least one of a first correction block and a second correction block, wherein the first correction block connects the resistance element in series, and includes a fourth pattern of the first conductive layer, a third conductive layer formed in the third wiring layer, and a fourth interlayer conductive layer connecting the first conductive layer and the third conductive layer, wherein the second correction block connects the resistance element in series, and includes a fifth pattern of the second conductive layer, the third conductive layer, and a fifth interlayer conductive layer connecting the second conductive layer and the third conductive layer, and wherein the first correction block and the second correction block respectively arrange bypass switches in parallel.

8. The semiconductor device according to claim 1, comprising:
a trimming circuit including a plurality of the resistance elements.

9. The semiconductor device according to claim 1, wherein the first via, the landing pad, and the second via overlap one another in plan view.

10. A semiconductor device comprising:
a semiconductor substrate;
a plurality of wiring layers formed over the semiconductor substrate; and
an oscillation circuit including a capacitance, and a trimming circuit having a resistance element formed on a plurality of wiring layers,
wherein an oscillating frequency of the oscillation circuit is represented a function of a capacity value of the capacitance and a resistance value of resistance element included in the trimming circuit,
wherein the resistance element has a main resistance in a direction perpendicular to the semiconductor substrate, and the main resistance formed by a plurality of materials,
wherein a ratio of the plurality of materials of main resistance is determined a temperature coefficient of the function to be zero,
wherein the plurality of wiring layers includes at least i) a first wiring layer, ii) a second wiring layer, and iii) a third wiring layer disposed between the first wiring layer and the second wiring layer; and
wherein the resistance element includes a repetitive pattern of i) a first conductive layer formed in the first wiring layer, ii) a second conductive layer formed in the second wiring layer, and iii) an interlayer conductive layer connecting the first conductive layer to the second conductive layer,
wherein the interlayer conductive layer includes a landing pad formed in the third wiring layer, a first via coupling the first conductive layer to the landing pad, and a second via coupling the second conductive layer to the landing pad, wherein the first via of the interlayer conductive layer is formed by one of a material of positive temperature coefficient and a material of negative temperature coefficient, wherein the second via of the interlayer conductive layer is formed by another one of the material of positive temperature coefficient and the material of negative temperature coefficient, and wherein, in plan view, a width of the first via, a width of the second via, and a width of the landing pad differ from one another.

11. The semiconductor device according to claim 10, wherein a ratio of the plurality of materials of main resistance is determined such that at least one of a first-order temperature coefficient and a second-order temperature coefficient is zero.

12. The semiconductor device according to claim 10, further comprising:
a counter counting number of clocks of the oscillation circuit in a predetermined period.

13. The semiconductor device according to claim 12, wherein the predetermined period is determined by reference clocks.

14. A pressure sensor comprising:
a semiconductor substrate;
a plurality of wiring layers formed over the semiconductor substrate and including a first wiring layer, a second wiring layer and a third wiring layer;
an oscillation circuit including a capacitance and a trimming circuit having a resistance element formed on a plurality of wiring layers; and
a counter counting number of clocks of the oscillation circuit in a predetermined period,
wherein the resistance element includes a plurality of pressure-sensitive conductive layers formed on the third wiring layer, and a connector unit formed between the first wiring layer and the second wiring layer, and the plurality of pressure-sensitive conductive layers are connected in serial via the connector unit,
wherein the connector unit includes a repetitive pattern having a first conductive layer formed in the first wiring layer, a second conductive layer formed in the second wiring layer, and an interlayer conductive layer connecting the first conductive layer and the second conductive layer,
wherein an oscillating frequency of the oscillation circuit is represented a function of a capacity value of the capacitance and a resistance value of resistance element included in the trimming circuit, and
wherein a ratio of a material of the pressure-sensitive conductive layer and a material of the interlayer conductive layer are determined a temperature coefficient of the function to be zero,
wherein the first interlayer conductive layer includes a landing pad formed in the third wiring layer, a first via coupling the first conductive layer to the landing pad, and a second via coupling the second conductive layer to the landing pad,
wherein the first via of the first interlayer conductive layer is formed by one of a material of positive temperature coefficient and a material of negative temperature coefficient,
wherein the second via of the first interlayer conductive layer is formed by another one of the material of positive temperature coefficient and the material of negative temperature coefficient, and
wherein, in plan view, a width of the first via, a width of the second via, and a width of the landing pad differ from one another.

15. The pressure sensor according to claim 14, wherein a ratio of the material of the pressure-sensitive conductive layer and the plurality of materials of the interlayer conductive layer are determined such that a first-order temperature coefficient and a second-order temperature coefficient is zero.

* * * * *